United States Patent [19]

Marciniak

[11] 4,349,841
[45] Sep. 14, 1982

[54] METHOD AND SYSTEM FOR INCREASING THE NUMBER OF INSTRUCTIONS TRANSMITTED IN DIGITAL SYSTEMS, I.A. IN SYSTEMS FOR REMOTE CONTROL OF TELEVISION RECEIVERS

[75] Inventor: Franciszek Marciniak, Warsaw, Poland

[73] Assignee: Zaklady Telewizyjne Unitrapolkolor Osrodek Badawczo-Rozwojwy Techniki Telewizyjnej, Warsaw, Poland

[21] Appl. No.: 108,077

[22] Filed: Dec. 28, 1979

[30] Foreign Application Priority Data

Dec. 30, 1978 [PL] Poland .................................. 212382

[51] Int. Cl.³ .............................................. H04N 5/44
[52] U.S. Cl. ............................ 358/194.1; 340/825.75; 455/352; 455/353
[58] Field of Search ..................... 358/194.1; 455/352, 455/353; 340/171 PF

[56] References Cited
U.S. PATENT DOCUMENTS 3,611,297  10/1971  Kramer .......................... 340/171 PF

*Primary Examiner*—Richard Murray
*Attorney, Agent, or Firm*—Ladas & Parry

[57] ABSTRACT

Method of increasing the number of instructions according to the invention consists therein that withing the command signal (6) additional instructions are transmitted, which after being decoded in the instruction decoder (1) and processed in the strobbin signal generation circuit (4) strobes the operation of additional controlled units (5) and control the transmission of the signal through the register (2) to the controlled units (3).

In the system according to the invention, between one of the outputs od the instruction decoder (1) and the unit (3) to be controlled the register (2) is connected, provided with an additional input for the record inhibiting instruction (10), whereas to the second output of the instruction decoder (1) the strobbing signal generation circuit (4) is connected aimed at controlling the additional controlled units (5). The register (2) and the strobbing signal generation circuit (4), employed in the system according to the invention, can be built-in into each of the integrated circuits or made in form of a separate integrated circuit.

5 Claims, 2 Drawing Figures

METHOD AND SYSTEM FOR INCREASING THE NUMBER OF INSTRUCTIONS TRANSMITTED IN DIGITAL SYSTEMS, I.A. IN SYSTEMS FOR REMOTE CONTROL OF TELEVISION RECEIVERS

This invention relates to a method and a system making it possible to increase the number of instructions transmitted in systems of remote control of television or radio receivers, and the like.

One of the known remote control systems is a system based on integrated circuits of the firm ITT. Similarly as in other systems, the instructions transmitted remotely are coded by a transmitter, for instance SAA1024, in an electric signal modulating a wave being able to propagate in the environment. In the receiver for instance SAA 1130, the coded electric signal is received and gives at its outputs the completely decoded output information signal and decoded output control signals.

In known application notes of the firm ITT the decoded output control signals control directly the receiving devices SAA1021, SAA1020. The decoder of information transmits also other decoded control signals, for instance analog adjustment signals, turning a signal on the power supply, and other signals necessary for the operation of the system. A certain part of the total number of instructions transmitted in the coded input signal constitutes a group of additional instructions for decoding by an additional instructions decoder controlled by the output signal.

The method of increasing the number of instructions transmitted in digital systems, i.a. in remote control systems of television receivers, according to the invention comprises transmitting in the control signal additional instructions which, on being decoded in an instruction decoder and after processing in a circuit for generating strobing signals, strobe the operation of additional controlled devices and control the transmission of the control signal through a register to main controlled units. In the system according to the invention two variants of operation of the system are distinguished. In the first variant an inhibiting signal coming out of the strobing signal generation circuit enables storage by the register of the real values being decoded, the output control signals, and controls with a suitable signal the main controlled units, while blocking by another suitable signal the additional controlled devices. In the second variant of the method according to the invention, after transmission of the additional instruction in the input signal, the storage inhibiting signal inhibits the register which stores the previous instruction and interruptedly controls the controlled unit, whereby simultaneously another strobing signal enables the additional controlled units to receive the controlling instruction.

In the system according to the invention the controlling of additional units is performed in the course of uninterrupted operation of controlled units.

In the system for increasing the number of instructions transmitted in digital systems, i.a. in remote control systems of television receivers, according to the invention, between one output of the instruction decoder and first controlled units a register is connected, having an additional input for a recording inhibiting signal, whereas to another output of the instruction decoder a strobing signal generation circuit is connected for controlling additional controlled units.

The inputs of the additional controlled units are connected with any outputs of the instruction decoder and with outputs of a register of the strobing circuit. The register and the strobing generation circuit, employed in the system according to the invention, can be built-in in one integrated circuit or may be made in the form of separate integrated circuits.

Referring to the aforementioned system of the firm ITT, the list of instructions thereof comprises 10 instructions used for basic servicing of the television receivers, 16 instructions for program selection and 5 additional instructions. In the method according to the invention, by using all the additional instructions, additionally $5 \times 16$ instructions are obtained. The number of all useful instructions in the method according to the invention amounts to $10 + 16 + 5 \times 16 = 106$ instructions, and thus by 75 instructions more than it was foreseen by the manufacturer of said systems.

Employing of the method and the system in a simple constructional arrangement enables one to multiply the number of transmitted signals, and simultaneously the number of units to be controlled. With reference to the system of the firm ITT, based on integrated circuits SAA1024, SAA1130, SAA1021, SAA1020, this enables one to employ additionally a teletext, a time programmer, an electronic watch, remote control of a radio receiver, tuning of a second head to observe another program, and other uses that were not possible and not foreseen by the manufacturer of said circuits.

The method and system according to the invention will be now described by means of an exemplary embodiment with reference to the accompanying drawing, wherein.

Figure 1:
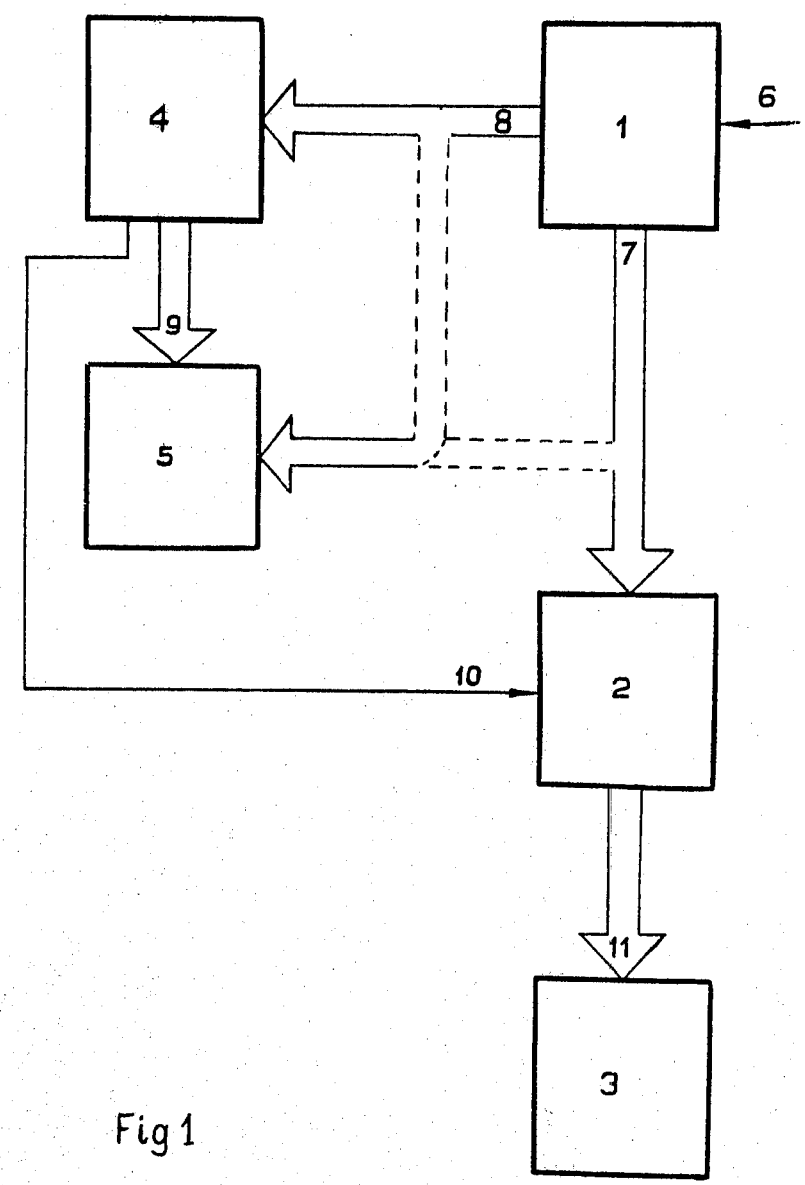
FIG. 1 is the block diagram of the system.
Figure 2:
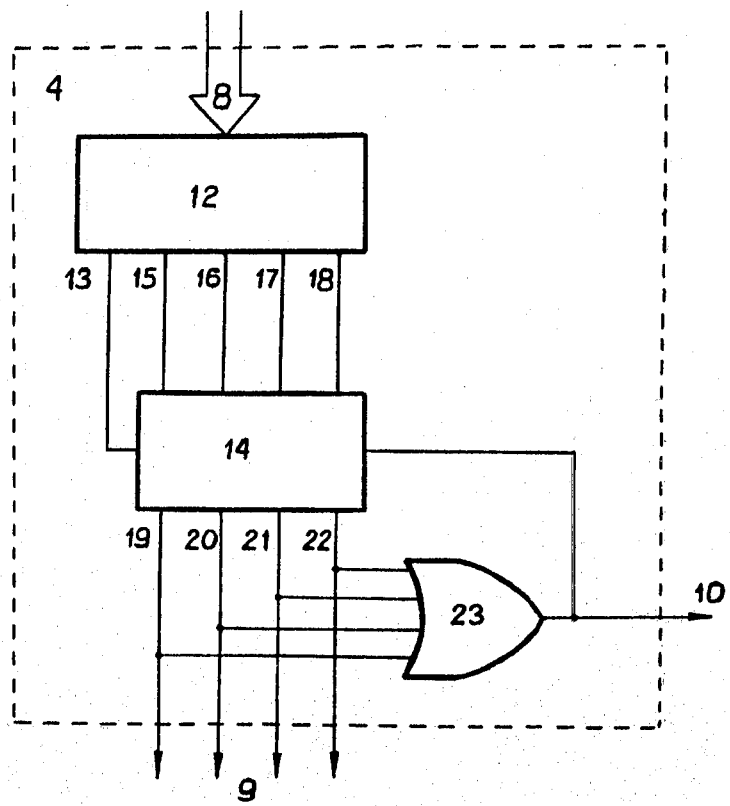
FIG. 2 is the connection diagram of the strobing circuit.

The system of an instruction invention consists of the decoder 1, one output of which is connected through a register 2 with units 3 to be controlled. Another output of the instruction decoder 1 is connected with a strobing signal generation system 4 to the output of which is connected an additional controlled unit 5 having inputs connected with either output of the decoder 1.

The strobing circuit 4 is equipped with a decoder 12 an output 13 of which is connected with the clearing input of a register 14, and outputs 15, 16, 17, 18 of which are connected with the recording inputs of the register 14. The registers outputs 19, 20, 21, and 22, however, are connected with the additional unit 5 (FIG. 1) and with an adding gate 23, the output 10 of which is connected with the record inhibiting input of the register 14 and with the record inhibiting input of the register 2.

In the method according to the invention, the control signal 6 received by the instruction decoder 1 is decoded into groups of instructions 7 and 8. The instructions 8 after being processed in the strobing signal generating circuit 4 strobe the operation of additional devices 5 in the form of a signal 9, and in the form of the inhibiting signal 10 they control the operation of the register 2. A part of instructions 8, after processing in the strobbing circuit 4, enables with the signal 10 the transmission of the instructions 7 through the register 2 to the controlled units 3 in the form of the decoded control signal 11. Simultaneously, the decoded instruction 8 blocks with the strobing signal 9 the receiving of instructions 7 or 8 by the additional units 5 to be controlled. After transmitting the additional information from the second part of the instructions 8 in the signal 6, the instruction 8 after processing in the strobing signal generating circuit 4 blocks with the signal 10 the register 2, which stores the previous signal 7 and uninterruptedly controls the units 3 to be controlled, and simultaneously enables the additional controlled units 5 to receive instructions 7 or 8. The transmission of an erasing instruction in the signal 6 causes the return to the previous way of transmission and the turning off of the additional units 5.

The controlling of additional units 5 in the method according to the invention by means of the signal 7 or 8 is performed in the course of uninterrupted controlling of the units 3 by means of the signal 11 from the register 2.

What is claimed is:

1. A method of increasing the number of instructions transmitted in remote control systems of television receivers and the like in which decoded signals directly control receiving units, comprising transmitting coded instructions in a command signal (6), decoding said instructions into a first part of an instruction signal (8), processing said first part of the instruction signal (8) in a strobing signal generation circuit (4) to provide a first signal (10) in a form for enabling the transmission of a control signal (7) through a register (2) in the form of a stored signal (11) to first receiving units (3) to be controlled while simultaneously providing a second signal (9) in a form for blocking the reception of one of said instruction signal (8) and said control signal (7) by additional receiving units (5) to be controlled, transmitting an additional coded instruction in said command signal, decoding said additional instruction into a second part of the instruction signal (8), processing said second part of the instruction signal (8) in said strobing signal generation circuit (4) to provide said first signal (10) in a form for blocking further storage of said control signal (7) in said register (2) while simultaneously providing said second signal (9) in a form for enabling the reception of said one of said instruction signal (8) and said control signal (7) by said additional receiving units (5) to be controlled, and transmitting a coded erasing instruction in said command signal for restarting the method.

2. A method according to claim 1, wherein the controlling of said additional receiving units (5) by one of said instruction signal (8) and said control signal (7) is performed while controlling said first receiving units (3) by said stored signal (11).

3. A system for increasing the number of instructions transmitted in remote control systems of television receivers and the like, comprising an instruction decoder (1), a first unit (3) to be controlled, a main register (2) connected between a first output of said instruction decoder and said first unit, an additional unit (5) to be controlled, and a strobing generation circuit (4) connected to a second output of said instruction decoder for controlling said additional unit, said additional unit having respective inputs connected to a strobing signal output of said strobing generation circuit and one of said first and second outputs of said instruction decoder.

4. A system according to claim 3, wherein said strobing generation circuit (4) has an inhibiting signal output (10) connected to an input of said main register (2) for inhibiting the storage in said main register of signals received from said first output of said instruction decoder.

5. A system according to claim 3, wherein said strobing generation circuit (4) includes an internal decoder (12), an internal register (14) and an adding gate (25), said internal decoder having outputs (13,15,16,17,18) connected to said internal register, said internal register having outputs (19–22) connected to said additional unit (5) and to said adding gate, said adding gate providing said inhibiting signal output (10) both to said main register (2) and to an inhibit input of said internal register.

* * * * *